(12) United States Patent
Sethi (10) Patent No.: US 12,282,900 B2
(45) Date of Patent: Apr. 22, 2025

(54) METHOD AND SYSTEM FOR DETERMINING COMPUTER FAN USAGE AND MAINTENANCE

(71) Applicant: Dell Products L.P., Round Rock, TX (US)

(72) Inventor: Parminder Singh Sethi, Punjab (IN)

(73) Assignee: Dell Products L.P., Round Rock, TX (US)

( * ) Notice: Subject to any disclaimer, the term of this patent is extended or adjusted under 35 U.S.C. 154(b) by 621 days.

(21) Appl. No.: 17/155,223

(22) Filed: Jan. 22, 2021

(65) Prior Publication Data
US 2022/0237570 A1    Jul. 28, 2022

(51) Int. Cl.
| | | |
|---|---|---|
| G07C 3/12 | (2006.01) | |
| G05B 19/042 | (2006.01) | |
| G06N 20/00 | (2019.01) | |
| G06Q 10/20 | (2023.01) | |
| G06Q 30/012 | (2023.01) | |
| G07C 3/06 | (2006.01) | |
| H04Q 9/00 | (2006.01) | |
| H05K 7/20 | (2006.01) | |
| G06F 1/20 | (2006.01) | |

(52) U.S. Cl.
CPC ........... *G06Q 10/20* (2013.01); *G05B 19/042* (2013.01); *G06N 20/00* (2019.01); *G06Q 30/012* (2013.01); *G07C 3/06* (2013.01); *G07C 3/12* (2013.01); *H04Q 9/00* (2013.01); *H05K 7/20209* (2013.01); *G05B 2219/49216* (2013.01); *G06F 1/20* (2013.01)

(58) Field of Classification Search
CPC .............. G07C 3/06; G06F 11/3433; G05B 2219/49216; G06Q 10/20
See application file for complete search history.

(56) References Cited

U.S. PATENT DOCUMENTS 7,146,521 B1    12/2006  Nguyen
7,451,332 B2 *  11/2008  Culbert .................. G06F 1/206
                                                          713/320

(Continued)

FOREIGN PATENT DOCUMENTS

KR            102109088 B1 *  5/2020  ......... G06F 9/45558

OTHER PUBLICATIONS

Machine Translation for KR102109088B1, obtained Dec. 2023 (Year: 2023).*
List of Patents or Applications Treated as Related, 2022.

*Primary Examiner* — Darrin D Dunn
*Assistant Examiner* — Vi N Tran
(74) *Attorney, Agent, or Firm* — Terrile, Cannatti & Chambers, LLP; Emmanuel A. Rivera (57) ABSTRACT

A system, method, and computer-readable medium are disclosed for attesting determining computer system fan usage and maintenance. A determination is made as to the architectural diagram or layout of a computer system. The diagram or layout shows components and fans that support the components. The architectural diagram or layout, where each virtual section shows a fan and the components. Operational load is determined for each virtual section over a period of time. A threshold value for particular periods to time, where the threshold value either is to low load periods or as to periods to increase or decrease speed of the fan to address operational load of the components.

20 Claims, 7 Drawing Sheets

(56) References Cited

U.S. PATENT DOCUMENTS

| | | | |
|---|---|---|---|
| 7,711,439 B2* | 5/2010 | Frankel | H05K 7/20209 |
| | | | 700/83 |
| 9,959,146 B2* | 5/2018 | Ahuja | G06F 9/5094 |
| 10,234,833 B2* | 3/2019 | Ahuja | G06F 1/206 |
| 10,512,196 B2* | 12/2019 | Song | H05K 7/20836 |
| 11,019,754 B2 | 5/2021 | Kharisov | |
| 11,133,773 B2* | 9/2021 | Nakagawa | H05K 7/20 |
| 2010/0131959 A1* | 5/2010 | Spiers | G06F 9/50 |
| | | | 718/105 |
| 2011/0227521 A1* | 9/2011 | Lu | G06F 11/0793 |
| | | | 318/431 |
| 2013/0111492 A1* | 5/2013 | Nojiri | G06F 1/206 |
| | | | 718/104 |
| 2014/0025223 A1* | 1/2014 | Chinnakkonda | G06F 1/206 |
| | | | 700/300 |
| 2014/0114496 A1* | 4/2014 | Berry | H05K 7/20836 |
| | | | 700/299 |
| 2017/0046236 A1* | 2/2017 | Borkenhagen | G06F 11/20 |
| 2017/0160771 A1 | 6/2017 | Albrecht et al. | |
| 2017/0315599 A1 | 11/2017 | Marripudi et al. | |
| 2018/0027057 A1* | 1/2018 | Balle | G06F 9/4881 |
| 2018/0260007 A1* | 9/2018 | Ping | H05K 7/20209 |
| 2019/0053405 A1* | 2/2019 | Wang | G06F 1/206 |
| 2019/0278648 A1 | 9/2019 | Nayak et al. | |
| 2020/0057478 A1 | 2/2020 | Hsieh et al. | |
| 2020/0241520 A1* | 7/2020 | Gross | G06F 11/3058 |
| 2021/0117859 A1* | 4/2021 | Rogers | G06N 3/045 |
| 2021/0357011 A1* | 11/2021 | Li | F24F 11/77 |
| 2021/0398155 A1* | 12/2021 | Shimo | H02J 3/008 |

* cited by examiner

METHOD AND SYSTEM FOR DETERMINING COMPUTER FAN USAGE AND MAINTENANCE

CROSS REFERENCE TO RELATED APPLICATIONS

U.S. patent application Ser. No. 17/155,801, entitled "Method and Apparatus for Proactively Countering the Effects of Storage Device Failure," filed Jan. 22, 2021, describes exemplary methods and systems and is incorporated by reference in its entirety.

BACKGROUND OF THE INVENTION

Field of the Invention

The present invention relates to maintenance of computer systems. More specifically, embodiments of the invention relate to determining the usage, maintenance, and replacement of fans in computer systems.

Description of the Related Art

Computer systems, such as server computers, typically include cooling fans that regulate the temperature of various components on the computer system. In certain implementations cooling fans can be hot swappable, meaning that cooling fans can be replaced while the computer system is operating. Therefore, the removal of a hot swappable cooling fan can affect the temperature and operation of components while the computer is operating.

Current implementations may provide for managed nodes of which a server computer can be part of. An alert can be provided as to cooling fan failure from the managed node. Implementations may provide for such an alert to be forwarded to administrative support. In the event the determination is made that a new cooling fan is needed, a new replacement cooling fan may be dispatched for replacement in the server computer.

Administrators or technicians responsible for the server computer and cooling fan replacement are tasked to determine an appropriate time to replace the cooling fan in the server computer. For example, certain operational times may be at critical load use of the server computer. The removal of a hot swappable cooling fan from an operating server computer can drastically increase the temperature of the server computer and can impact components such as hard disk drives (HDDs), controllers/processors, memories, etc. Therefore, if administrators or technicians are not aware of an optimal time period to replace a faulty cooling fan, issues can result that can affect components of an operating server computer. Typically, alerts as to cooling fan replacement are addressed at the server computer level, meaning that temperature consideration is made as to the totality of how all of the components of the server computer are affected. For example, a background job that is running on the server computer may increase the temperature of processing units but might not impact the temperature of other components. A decrease of speed of one cooling fan in the server computer may increase the temperature of components in the trajectory of that particular cooling fan; however, such a decrease is not applicable to other components that are not in the trajectory.

SUMMARY OF THE INVENTION

A system, method, and computer-readable medium are disclosed for attesting determining computer system fan usage and maintenance. A determination is made as to the architectural diagram or layout of a computer system, such as server computer. The diagram or layout shows components and fans that support the components. The architectural diagram or layout, where each virtual section shows a fan and the components supported by the fan. Operational load is determined for each virtual section over a period of time. A threshold value for particular periods to time, where the threshold value either is to low load periods in which a fan can be replaced or as to periods to increase or decrease speed of the fan to address operational load of the components.

BRIEF DESCRIPTION OF THE DRAWINGS

The use of the same reference number throughout the several figures designates a like or similar element. The present invention may be better understood, and its numerous objects, features, and advantages made apparent to those skilled in the art by referencing the accompanying drawings, wherein.

DETAILED DESCRIPTION

A system, method, and computer readable medium are disclosed determining the usage, maintenance, and replacement of cooling fans in computer systems, such as server computers.

Implementations provide for a determination as to optimal times to replace cooling fans in a server computer with minimal impact of temperature at the component level, including replacement during operation of a server computer.

In various implementations, an architectural diagram or layout of components and cooling fans of a particular model server computer is retrieved. The particular model of server computer can be based on model number, generation, and/or type. Using the architectural diagram or layout, a virtual division is made as to multiple and distinct sections with boundaries that are supported by respective cooling fans.

Implementations can be implemented using a machine learning/artificial intelligence (ML/AI) framework and algorithms that are ran on each virtual section. The ML/AI framework and algorithms predict work load of each virtual section by summing the load of each component of the respective virtual section based on a period of time. Based on the determined load, scores can be determined as to each virtual section. Such scores can be used to determine optimal times for cooling fan replacements.

In certain implementations, load and scores that are determined can be used to adjust speed of particular cooling fans and can proactively address temperature changes (e.g., adverse temperature increases) due to load of components on the server computer.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
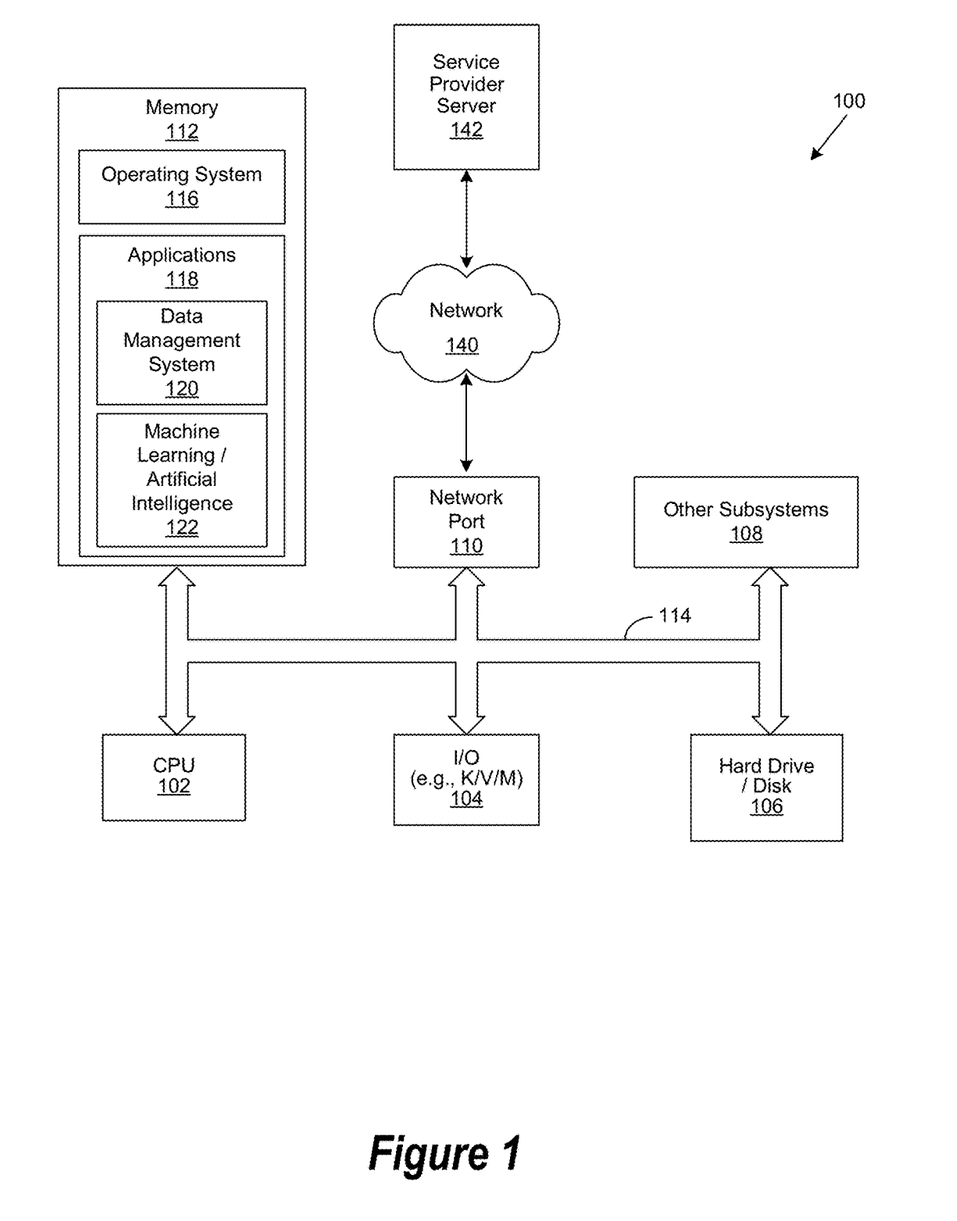
FIG. 1 depicts a general illustration of a computing system as implemented in the system and method of the present invention.

FIG. 1 illustrates an information handling system 100 that can be used to implement the system and method of the present invention. The information handling system 100 includes a processor (e.g., central processor unit or "CPU") 102, input/output (PO) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The network 140 may be a public network, such as the Internet, a physical private network, a wireless network, a virtual private network (VPN), or any combination thereof. Skilled practitioners of the art will recognize that many such embodiments are possible, and the foregoing is not intended to limit the spirit, scope or intent of the invention.

The information handling system 100 likewise includes system memory 112, which is interconnected to the foregoing via one or more buses 114. System memory 112 further includes an operating system (OS) 116 and applications 118. In certain embodiments, applications 118 are provided as a service from the service provider server 142.

Certain embodiments provide for applications 118 to include a distributed a data management system 120, and a machine learning/artificial intelligence (ML/AI) platform 122 that includes ML/AI algorithms. The data management system 120 and ML/AI platform 122 are further described herein.

Figure 2:
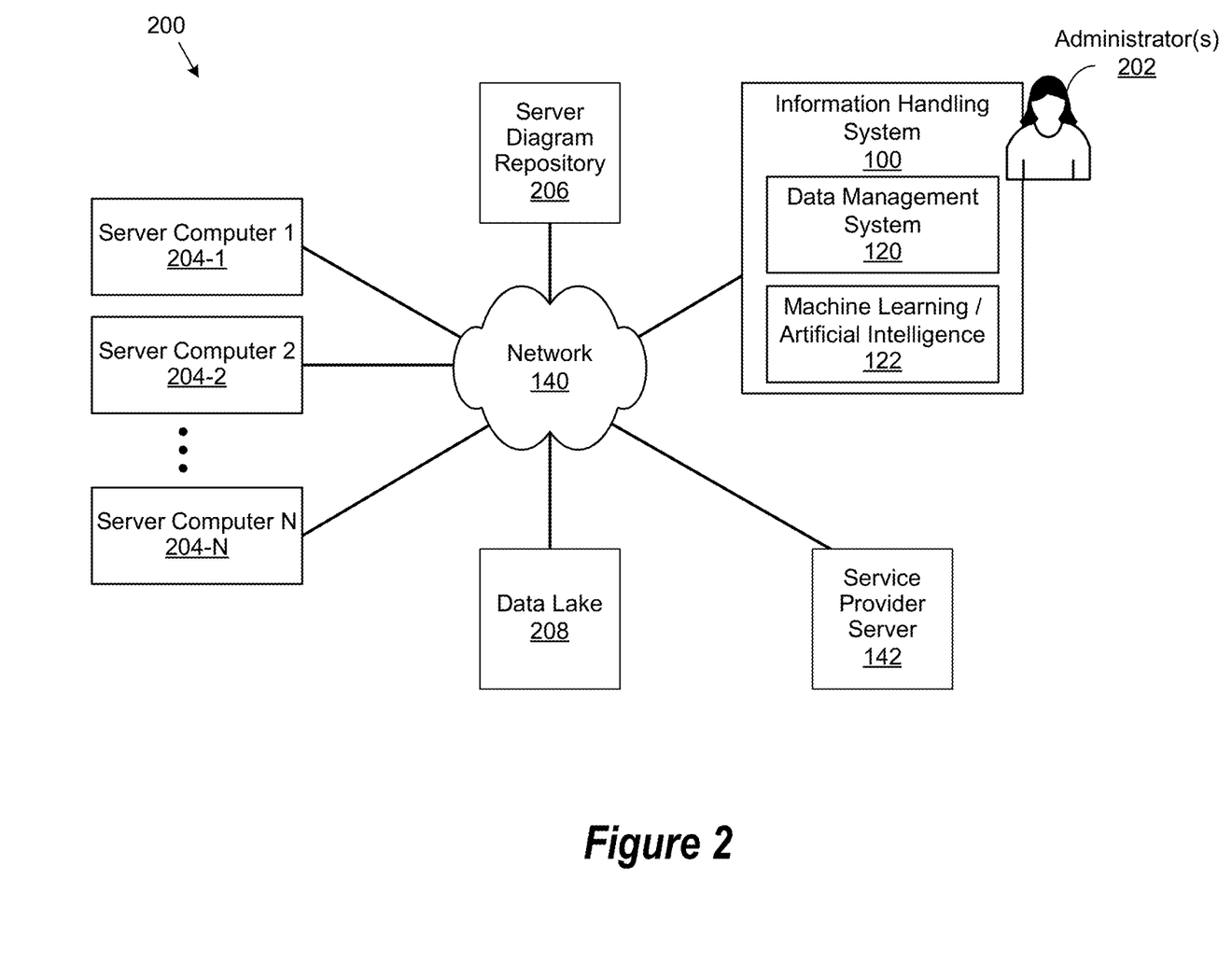
FIG. 2 depicts a system for determining the usage, maintenance, and replacement of fans in computer systems.

FIG. 2 is a simplified block diagram of a system for determining the usage, maintenance, and replacement of cooling fans in computer systems, such as server computers. In particular, the system 200 provides information handling system 100 to be accessed by administrators or technicians, as represented by administrator(s) 202. For various implementations, the information handling system 100 can be configured as a laptop computer accessibly by administrator(s) 202, and as described connected to network 140.

Implementations provide for the information handling to monitor and be connected by network 140 to one or more server computers, as represented by server computer 1 204-1, server computer 2 204-2 to server computer N 204-N. The server computers 204 may be considered as group or node that supports a larger computing system.

As discussed, a service provider server 142 can be connected to network 140 and in various implementations is part of the system 200. Embodiments can further provide for the system 200 to include a server diagram repository 206. The server diagram repository 206 can store architectural diagrams or layouts of server computers (i.e., computer systems/devices) illustrating configurations of server computer components and cooling fans. Particular models of server computers can be based on model number, generation, and/or type. Using the architectural diagram or layout, as further described herein a virtual division is made as to multiple and distinct sections with boundaries that are supported by respective cooling fans. Implementations provide for the server provider server 142 or the information handling system 100 (i.e., ML/AI framework 122) to determine virtual division based on the architectural diagram or layout of server computer.

Various embodiments can provide for the system 200 to include a data lake 208. Implementations provide for the data lake 208 to be formed or to include (i.e., collect) historical and current telemetry information of components of servers 204, as to load over a period of time. Data lake 208 can further include cases or tickets (e.g., scores) as to information or data of component loads as to particular sections and cooling fans that support such sections of particular server computers 204. Such information or data can be provided to the ML/AI framework 122 to create recommendations as to optimal times to replace hot swappable cooling fans in particular server computers 204.

Figure 3:
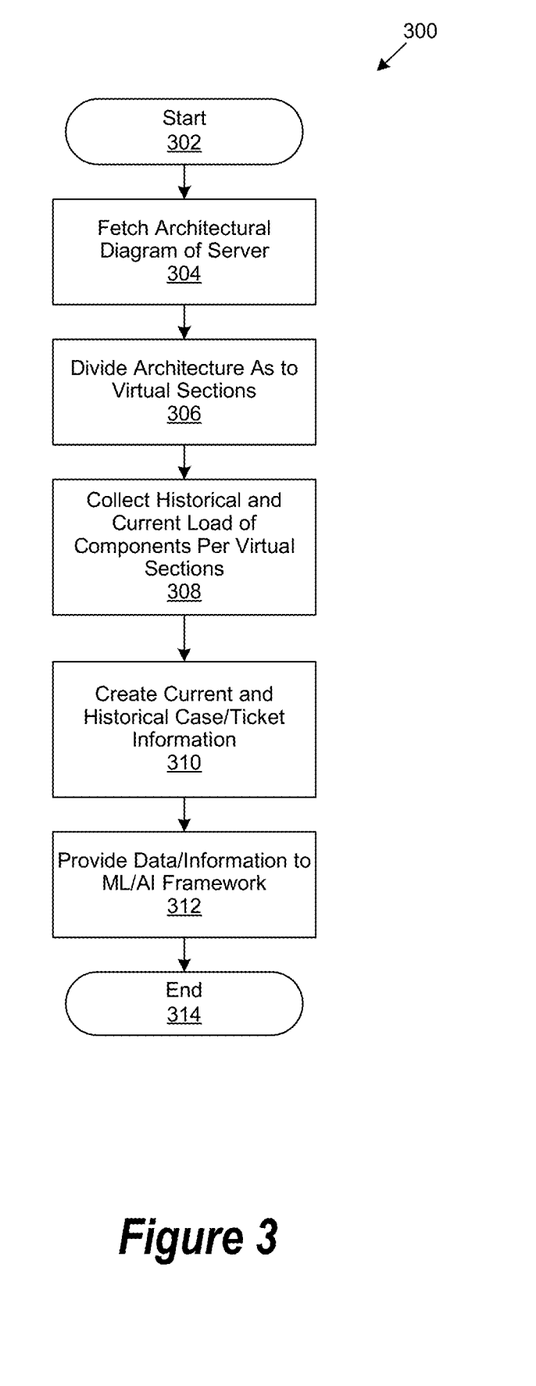
FIG. 3 shows a flow chart collecting component load information for virtual sections of server computers.

FIG. 3 is a generalized flowchart 300 for collecting component load information for virtual sections of server computers. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At step 302, the process 300 starts. At step 304, fetching an architectural diagram or layout of a server computer is performed. A determination can be made as to a particular server computer (e.g., server computers 204) and can be based on model number, generation, and/or type. Such architectural diagram or layout illustrates how components are integrated (i.e. laid out) on a server computer, and how cooling fans are laid out per the computer server. Implementations provide for the architectural diagram or layout to be fetched from server diagram repository 206.

At step 306, dividing the architectural diagram or layout into virtual sections is performed. The dividing is based on sections or areas for which cooling fans support. This is further described herein. Implementations provide for service provider server 142 or information handling system 100 (i.e., ML/AI framework 122) to perform step 304 step 306.

At step 308, collecting historical and current load of components per virtual sections is performed. The collection can be performed over a certain time period as further described herein. As described collection can be made at the data lake 208.

At step 310, creating historical and current cases/tickets as to components of the server computer is performed. The cases/tickets identify the components and virtual sections they are part of. As discussed, determination is over a certain time period. The cases/tickets can be stored or kept at the data lake 208.

At step 312, providing the data of the historical and current cases/tickets as described in step 310 is performed. Implementations provide for the data to be consumed by the ML/AI platform 122. The ML/AI platform 122 can use this data to determine optimal times to replace faulty cooling fans and/or adjust speed of cooling fans to preempt possible overheating of components in server computers. At step 314, the process 300 ends.

Figure 4:
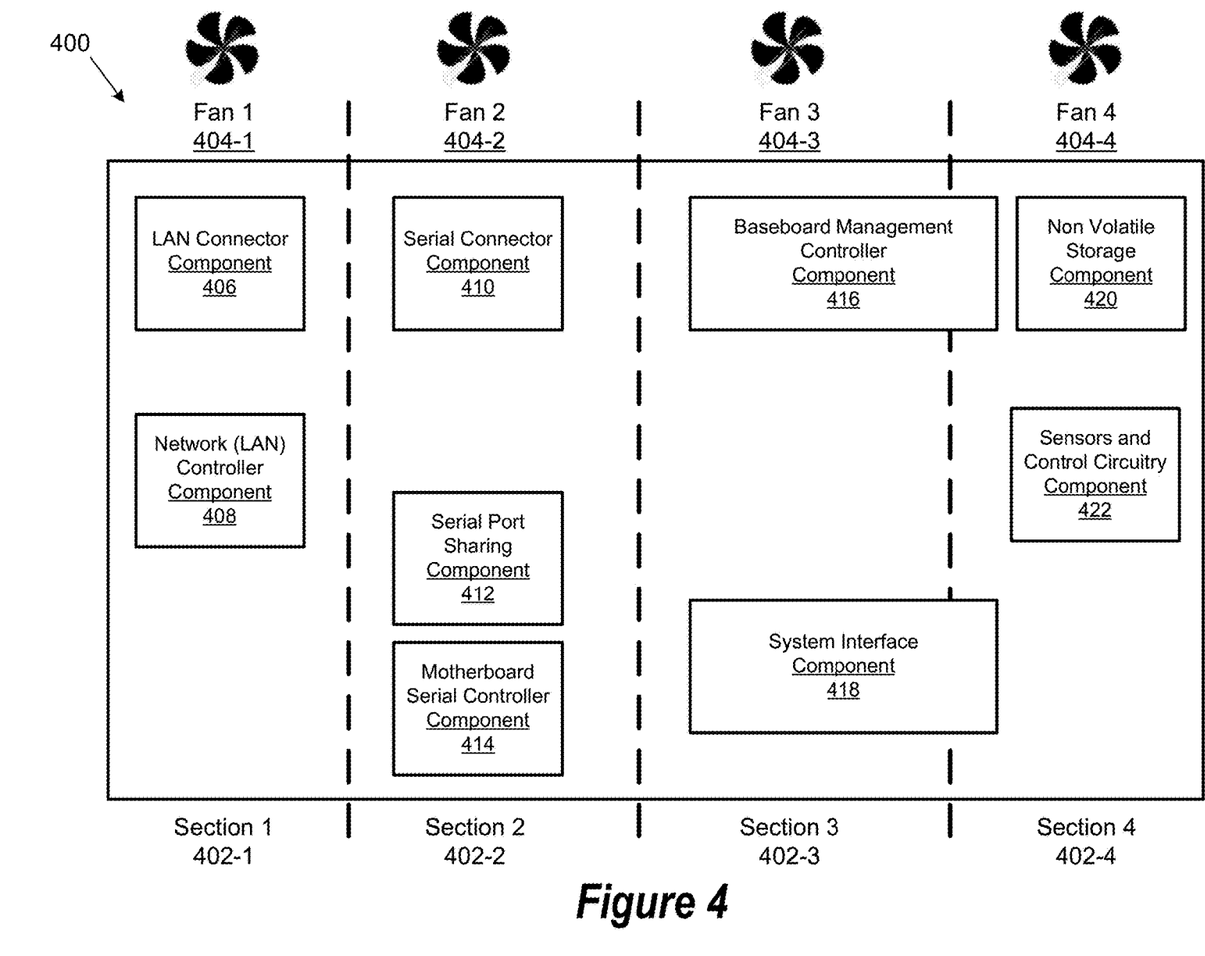
FIG. 4 shows a diagram that divides a server architecture into virtual sections.

FIG. 4 illustrates a diagram that divides a server architecture into virtual sections. The diagram or layout 400 is an example of the placement of components on a particular server computer. The diagram or layout 400 is divided into multiple virtual sections. In this example there are four virtual sections, section 1 402-1, section 2 402-2, section 3 402-3 and section 4 404-4.

Each virtual section 402 corresponds to a cooling fan that supports or regulates cooling for the particular section 402. In this example, fan 1 404-1 regulates cooling for section 1 402-1, fan 2 404-2 regulates cooling for section 2 402-2, fan 3 404-3 regulates cooling for section 3 402-3, and fan 4 404-4 regulates cooling for section 4 402-4. Therefore, server computer space is divided into multiple virtual sections, where the division is based on cooling fans 204, and specifically slots of the computer server of cooling fans 204.

The diagram or layout 400 identifies the placement of components as to virtual sections. In this example, the identified components of the server computer are component 406 (LAN connector), component 408 (network (LAN) connector), component 410 (serial connector), component 412 (serial port sharing), component 414 (motherboard serial controller), component 416 (baseboard management controller), component 420 (non-volatile storage), and component 422 (sensors and control circuitry).

The components of diagram or layout 400 are in at least one virtual section 402, providing an input load as to each virtual section 402. In the case of component 416 and component 418, there is an overlap between section 402-3 and 402-4. If a component is shared by multiple sections (e.g., components 416 and 418 by sections 402-3 and 404-4), then load of that shared component is considered in all the sections. Therefore, if the value "x" is the load of component 416, then the value "x" is considered (e.g., added) in the load value for both section 3 404-3 and section 404-3.

In various implementations, the load values of each section 402 can be calculated using the ML/AI framework 122. Additional calculation can be performed by the ML/AI framework 122 for determining optimal replacement times and adjusting of the speed of specific fans 404.

Figure 5:
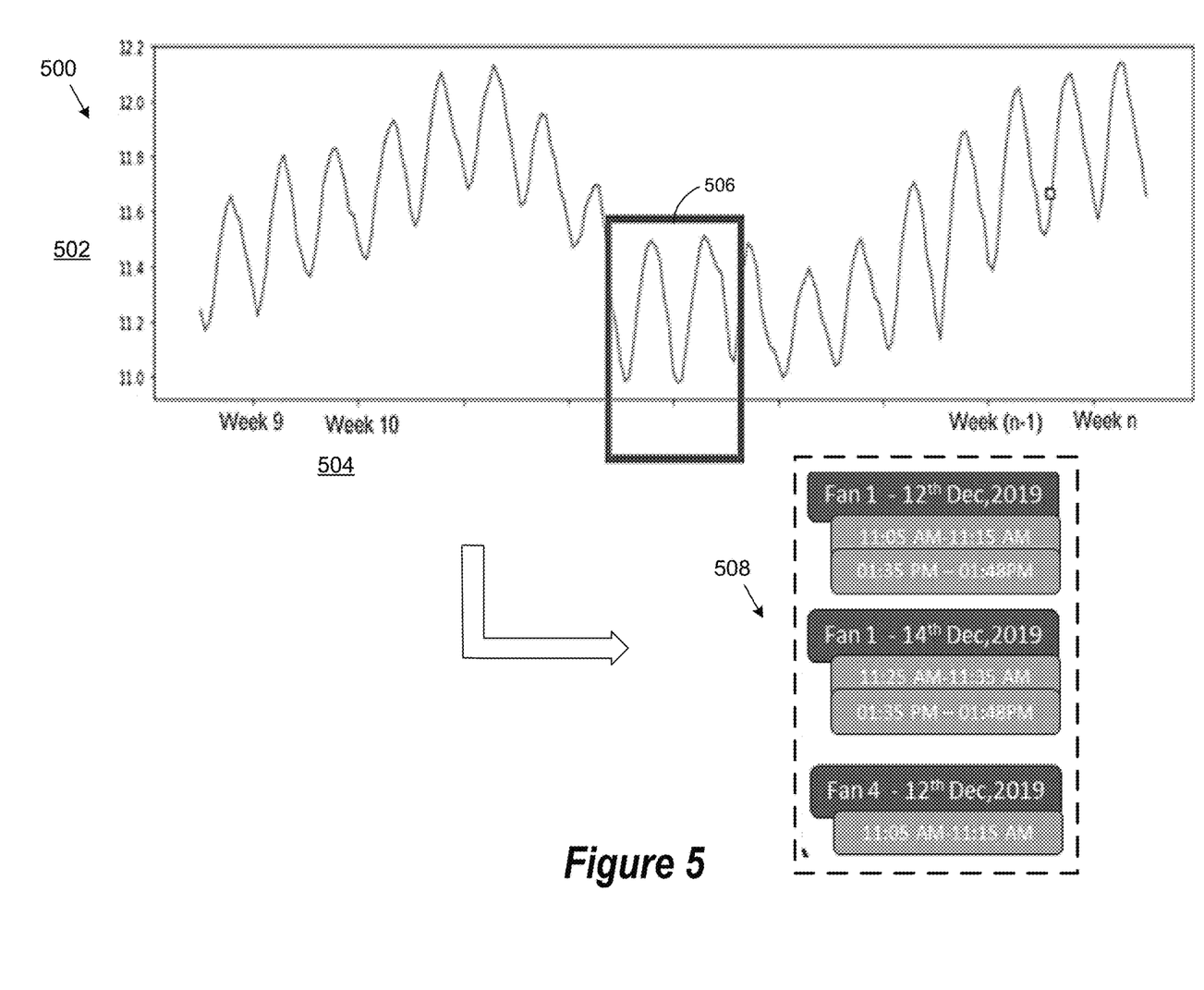
FIG. 5 shows a load graph as to virtual sections results for a low operational load of components supported by a cooling fan of a virtual section.

FIG. 5 illustrates a load graph as to virtual sections results for a low operational load of components supported by a cooling fan of a virtual section. A load graph 500 is plotted for a particular virtual section (e.g., virtual section 402). The load is for a cumulative operational load of all the components in that virtual section. Load value is plotted on the x-axis 502 of the load graph 500, and time (e.g. dates) is plotted on the y-axis 504 of the load graph 500.

Load graph 500 can be historical or predictive load for a virtual section. For example, a predictive load can be for "n" weeks from the day a dispatch for a replacement cooling fan was provided by a vendor. In the load graph 500, the area 506 illustrates a minimal load. Therefore, the time represented by the area 506 can be an optimal time to replace a faulty time for the particular cooling fan (e.g., fan 404) that supports the virtual section of load graph 500.

The value of "n" can be determined by the following factors, a service level agreement of a vendor for fan dispatch or the number of days left for fan failure. The value of "n" can be the higher of the factors.

Based on the load graphs, optimal times as to replacement can be identified, as represented by 508. In this example, 508 shows times for possible replacement for a "fan 1" and a time for possible replacement for a "fan 4."

In certain implementations, the load graph 500 can be used to identify when operational speed of cooling fans can be lowered or increased. A higher component load for a virtual section, at a particular time can indicate a higher temperature at that virtual section and necessitating an increased speed of the cooling fan that supports that virtual section. Therefore, a preemptive increase in cooling fan speed can be performed before reaching a critical operating temperature of components in that virtual section. Likewise, the speed of the cooling fan can be decreased during time of low operational load.

Figure 6:
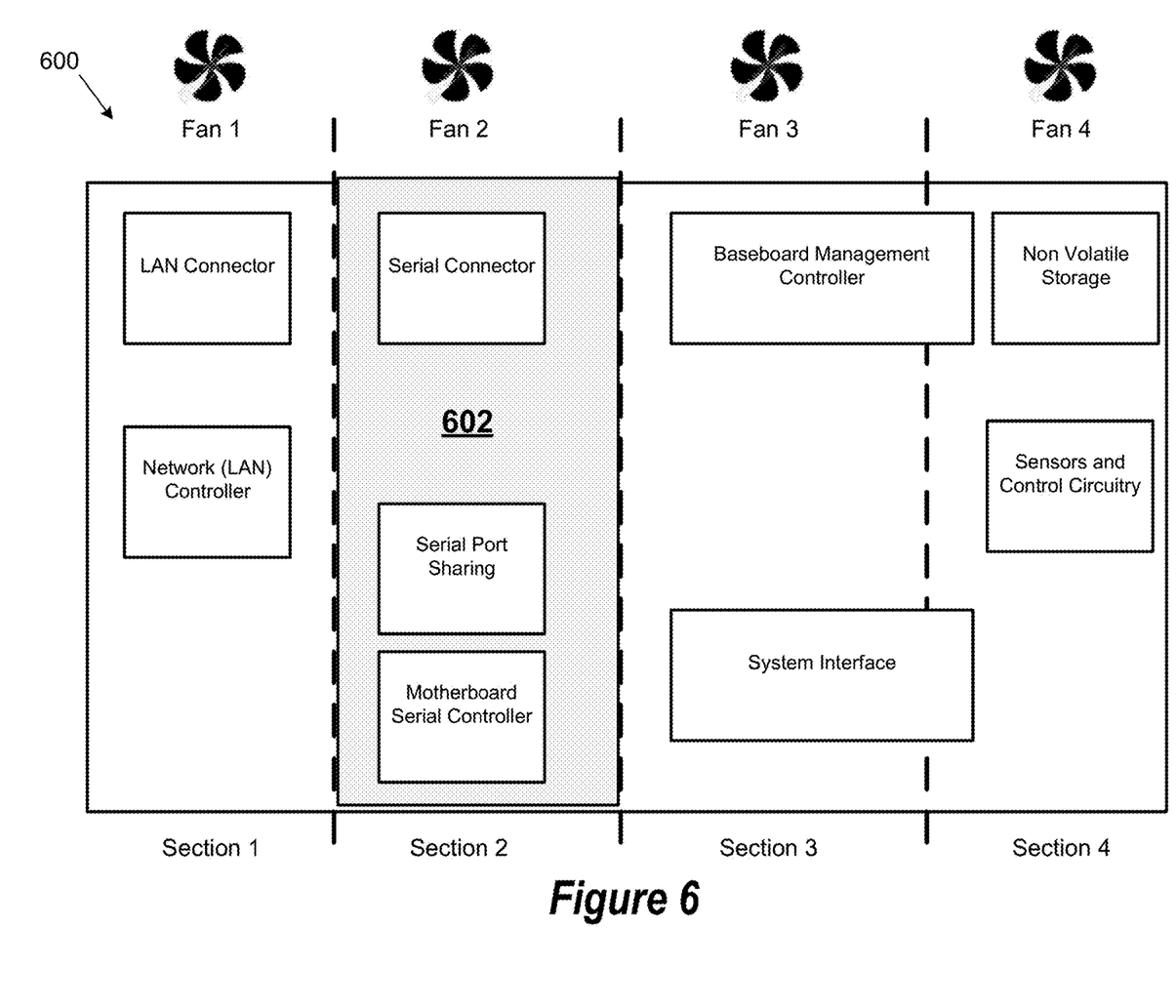
FIG. 6 shows screen presentation of virtual section operational loads user interface.

FIG. 6 shows an example graphical user interface of virtual section operational loads. The user interface 600 provides views as to virtual sections where aggregate component load in a virtual section corresponds to particular load levels, such as certain threshold levels. For example, a virtual section may be highlighted by a color, shading, hatching, etc. indicating a "heavy" load is reached. This is represented by 602. In certain implementations, a user (e.g., administrator 202) at information handling system through the data management system 120 can view the user interface 600. Implementations provide for the user interface 600 to allow for the user to choose a particular fan and respective time slot to change the fan. Furthermore, implementations through user interface 600 and the data management system 120 allow displaying of status of the virtual section as highlighted. The highlighting of the virtual section can be for a selected time interval, and in certain implementations can be for real time operation.

Figure 7:
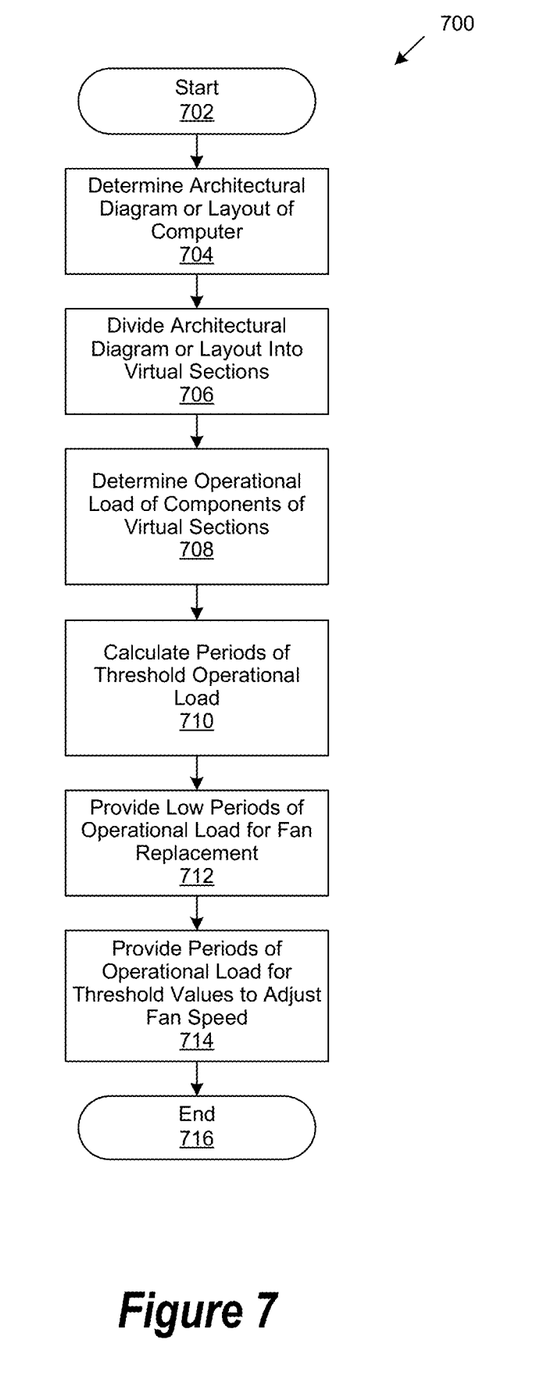
FIG. 7 shows a flow chart for attesting component certificates to particular devices, such as computer systems.

FIG. 7 is a generalized flowchart 700 for determining computer fan usage and maintenance. Implementations provide for the information handling system 100 (i.e., ML/AI framework 122) or service provider server 142 or to perform process 700. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At step 702, the process 700 starts. At step 704, determining architectural diagram or layout is performed. As discussed, the determining architectural diagram or layout is specific as to a computer system such as a server computer under evaluation.

At step 706, dividing the architectural diagram or layout is performed into virtual sections is performed. As discussed, the virtual sections including a cooling fan and the components of the computer system which the cooling fan supports.

At step 708, determining operational load of the components of the virtual sections is determined. The operational load is an aggregate load of the components for each virtual section. The operational load can be determined per historic periods of operation and/or current periods of operation when the computer server is running. As discussed, a load graph (e.g., load graph 500) can be created based on the determining.

At step 710, calculating periods of threshold operational loads are calculated based are performed. The threshold operational loads can be based on low operational load periods, high operational load periods, and/or other threshold values. The periods of threshold operational load can be derived from the load graph of step 708.

At step 712, providing low load periods of operation load for fan replacement is performed. The low load periods of load graph can indicate that components of a virtual section at such periods are either not running or running at reduced capacity. Therefore, at such low load periods, a cooling fan that supports such component of the virtual section operates at a reduced capacity/speed or does not need to operate.

At step 714, providing periods of operational load as to threshold values to adjust fan speed is performed. To preemptive increase speed of a cooling fan to address higher operating temperatures before an alert is generated, a threshold value can be set for an operational load of components in a virtual section. Therefore, when the threshold value is reached, the speed of the cooling fan can be increased before an alert temperature is reached. The alert temperature due to an increased in operational load of the components in the virtual section. At step 716, the process 700 ends.

As will be appreciated by one skilled in the art, the present invention can be embodied as a method, system, or computer program product. Accordingly, embodiments of the invention can be implemented entirely in hardware, entirely in software (including firmware, resident software, microcode, etc.) or in an embodiment combining software and hardware. These various embodiments can all generally be referred to herein as a "circuit," "module," or "system." Furthermore, the present invention can take the form of a computer program product on a computer-usable storage medium having computer-usable program code embodied in the medium.

Any suitable computer usable or computer readable medium can be utilized. The computer-usable or computer-readable medium can be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium can be any medium that can contain, store, communicate, or transport the program for use by or in connection with the instruction execution system, apparatus, or device.

Computer program code for carrying out operations of the present invention can be written in an object oriented programming language such as Java, Smalltalk, C++ or the like. However, the computer program code for carrying out operations of the present invention can also be written in conventional procedural programming languages, such as the "C" programming language or similar programming languages. The program code can execute entirely on the user's computer, partly on the user's computer, as a stand-alone software package, partly on the user's computer and partly on a remote computer or entirely on the remote computer or server. In the latter scenario, the remote computer can be connected to the user's computer through a local area network (LAN) or a wide area network (WAN), or the connection can be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions can also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A computer-implementable method for determining computer system fan usage and maintenance comprising:
   determining by a machine learning/artificial intelligence (ML/AI) platform an architectural layout of the computer system;
   dividing by the ML/AI platform, the architectural layout into machine readable virtual sections as to multiple and distinct sections that include operational boundaries of cooling fans;
   reading and applying algorithms of the ML/AI platform to each virtual section to predict work load of the cooling fans, by summing the load of each cooling fan represented in a respective virtual section based on a period of time;

using the loads to adjust speed of cooling fans and proactively address temperature changes;

collecting loads of the virtual section used for replacing and adjusting fans based on historical and predicted loads;

calculating by the ML/AI platform based on a threshold value applied to the algorithms, periods of operational load over the period of time; and adjusting the speed of the cooling fans based on the periods of operational load.

2. The method of claim 1 further comprising providing periods for fan replacement if the threshold value is a low operational load value.

3. The method of claim 2, wherein a value of "n" are time units a dispatch for a replacement fan was last provided, and "n" can be determined by a service agreement or the number of time units left for fan failure.

4. The method of claim 1 further comprising providing periods to adjust fan speed based on an increase or decrease of operational load value.

5. The method of claim 1, wherein the determining architectural layout of the computer system comprises fetching a specific architectural layout from a repository.

6. The method of claim 1, wherein the determining operational load comprises creating a load graph.

7. The method of claim 1, wherein the determining operational load is based on historical and current telemetry information of components.

8. A system comprising:
a processor;
a data bus coupled to the processor; and
a non-transitory, computer-readable storage medium embodying computer program code, the non-transitory, computer-readable storage medium being coupled to the data bus, the computer program code interacting with a plurality of computer operations and comprising instructions executable by the processor and configured for:

determining by a machine learning/artificial intelligence (ML/AI) platform an architectural layout of the computer system;

dividing by the ML/AI platform, the architectural layout into machine readable virtual sections as to multiple and distinct sections that include operational boundaries of cooling fans;

reading and applying algorithms of the ML/AI platform to each virtual section to predict work load of the cooling fans, by summing the load of each cooling fan represented in a respective virtual section based on a period of time;

using the loads to adjust speed of cooling fans and proactively address temperature changes;

collecting loads of the virtual section used for replacing and adjusting fans based on historical and predicted loads;

calculating by the ML/AI platform based on a threshold value applied to the algorithms, periods of operational load over the period of time; and adjusting the speed of the cooling fans based on the periods of operational load.

9. The system of claim 8 further comprising providing periods for fan replacement if the threshold value is a low operational load value.

10. The system of claim 9, wherein a value of "n" are time units a dispatch for a replacement fan was last provided, and "n" can be determined by a service agreement or the number of time units left for fan failure.

11. The system of claim 8 further comprising providing periods to adjust fan speed based on an increase or decrease of operational load value.

12. The system of claim 8, wherein the determining architectural layout of the computer system comprises fetching a specific architectural layout from a repository.

13. The system of claim 8, wherein the determining operational load comprises creating a load graph.

14. The system of claim 8, wherein the determining operational load is based on historical and current telemetry information of components.

15. A non-transitory, computer-readable storage medium embodying computer program code, the computer program code comprising computer executable instructions configured to:

determine by a machine learning/artificial intelligence (ML/AI) platform an architectural layout of the computer system;

divide by the ML/AI platform, the architectural layout into machine readable virtual sections as to multiple and distinct sections that include operational boundaries of cooling fans;

read and apply algorithms of the ML/AI platform to each virtual section to predict work load of the cooling fans, by summing the load of each cooling fan represented in a respective virtual section based on a period of time;

use the loads to adjust speed of cooling fans and proactively address temperature changes;

collect loads of the virtual section used for replacing and adjusting fans based on historical and predicted loads;

calculate by the ML/AI platform based on a threshold value applied to the algorithms, periods of operational load over the period of time; and adjust the speed of the cooling fans based on the periods of operational load.

16. The non-transitory, computer-readable storage medium of claim 15 further comprising instructions to provide periods for fan replacement if the threshold value is a low operational load value.

17. The non-transitory, computer-readable storage medium of claim 15 further comprising instructions to provide periods to adjust fan speed based on an increase or decrease of operational load value.

18. The non-transitory, computer-readable storage medium of claim 15, wherein the instructions to determine architectural layout of the computer system comprises fetching a specific architectural layout from a repository.

19. The non-transitory, computer-readable storage medium of claim 15, wherein the instructions to determine operational load comprises creating a load graph.

20. The non-transitory, computer-readable storage medium of claim 15, wherein the instructions to determine operational load is based on historical and current telemetry information of components.

* * * * *